United States Patent [19]

Collier et al.

[11] 4,393,312

[45] Jul. 12, 1983

[54] VARIABLE-SPOT SCANNING IN AN ELECTRON BEAM EXPOSURE SYSTEM

[75] Inventors: Robert J. Collier, New Providence; Michael G. R. Thomson, Berkeley Heights, both of N.J.

[73] Assignee: Bell Telephone Laboratories, Incorporated, Murray Hill, N.J.

[21] Appl. No.: 855,608

[22] Filed: Nov. 29, 1977

Related U.S. Application Data

[63] Continuation of Ser. No. 655,427, Feb. 5, 1976, abandoned.

[51] Int. Cl.³ .............................................. H01J 37/00
[52] U.S. Cl. .............................. 250/492.2; 250/358.1; 378/58
[58] Field of Search .............. 250/492 A, 398, 396 R; 313/360, 361

[56] References Cited

U.S. PATENT DOCUMENTS

| | | |
|---|---|---|
| 3,547,074 | 12/1970 | Hirschfeld . |
| 3,638,231 | 1/1972 | LePoole et al. . |
| 3,644,700 | 2/1972 | Kruppa et al. .................. 250/492 A |
| 3,801,792 | 4/1974 | Lin . |
| 3,855,023 | 12/1974 | Spicer et al. .................... 250/492 A |
| 3,876,883 | 4/1975 | Broers et al. .................. 250/492 A |
| 3,900,737 | 8/1975 | Collier et al. . |
| 3,956,635 | 5/1976 | Chang . |

OTHER PUBLICATIONS

"A New Electron Beam Exposure Scheme of Scanning Type", Soma et al., *IEDM Technical Dig.*, pp. 20–23, 1975.

"The Application of Electron/Ion Beam Technology to Microelectronics", Brewer, *IEEE Spectrum*, Jan. 1971, pp. 23–36.

"A High Current Square Spot Probe for Micro Pattern Generation", Pfeiffer et al., *Septieme Congres International de Microscopie Electronique*, 1970, pp. 63–64.

*Primary Examiner*—Bruce C. Anderson
*Attorney, Agent, or Firm*—Lucian C. Canepa

[57] ABSTRACT

For a given resolution or address dimension, the pattern-writing speed of an electron beam exposure system is increased by utilizing a new mode of raster scanning. In the new mode, the writing spot dimensions of the electron beam are varied rapidly during the scan. In an electron column designed for variable-spot raster scanning, an illuminated aperture is demagnified to form the writing spot. By imaging a first aperture upon a second aperture and rapidly deflecting the image of the first aperture, the portion of the second aperture that is illuminated by the electron beam is altered. In that way, the spot size is selectively varied in a high-speed way during the raster scanning process.

25 Claims, 18 Drawing Figures

VARIABLE-SPOT SCANNING IN AN ELECTRON BEAM EXPOSURE SYSTEM

CROSS-REFERENCE TO RELATED APPLICATION

This application is a continuation of application Ser. No. 655,427, filed Feb. 5, 1976 now abandoned.

BACKGROUND OF THE INVENTION

This invention relates to an apparatus and a method for fabricating microminiature devices and, more particularly, to a variable-spot raster scanning technique for use in an electron beam exposure system.

U.S. Pat. No. 3,900,737, which issued to R. J. Collier and D. R. Herriott on Aug. 19, 1975, describes an electron beam exposure system (EBES) that is a practical tool for generating high-quality fine-featured integrated circuit masks. The system is also capable of exposing patterns directly on resist-coated semiconductor wafers. EBES combines continuous translation of the mask or wafer substrate with periodic deflection of the electron beam in a raster-scan mode of operation.

The EBES exposure process requires a beam of electrons emitted from a cathode to be focused to a submicron-size spot on an electron-sensitive resist layer. In practice, the diameter of the spot is also the address dimension of the system. In one particular practical embodiment of EBES, the electron beam is focused to a spot 0.5 micrometers ($\mu$m) in diameter on the resist layer and is modulated on and off as the spot is successively scanned in raster fashion across a subregion of the layer. Each scan line of the raster has a width of one address dimension and a length of 256 address dimensions. Such a system meets important current needs for moderate-resolution devices (about 2-$\mu$m linewidths with 0.5-$\mu$m resolution) but does not illustrate the ultimate limits of the capabilities of EBES.

Various modifications of EBES are possible to adapt it to meet the increasing demand for devices with still smaller features. For example, if it is desired to write 1-$\mu$m minimum features with 0.25-$\mu$m resolution, using the EBES scanning mode described in the aforecited patent, an electron spot 0.25 $\mu$m in diameter can be employed. However, the penalty that is thereby incurred is that the time required to expose a given area of the resist is increased by a factor of four. For many proposed applications of practical importance this is an economically burdensome penalty which is not acceptable. Thus, considerable effort has been directed at trying to devise a way in which to decrease the resolution or address dimension of EBES without at the same time increasing the pattern-writing speed of the system. Moreover, it was recognized that such a way, if available, would also increase the pattern-writing speed of EBES in its aforementioned moderate or 0.5-$\mu$m resolution mode.

SUMMARY OF THE INVENTION

Accordingly, an object of the present invention is an improved scanning technique for an electron beam exposure system.

More specifically, an object of this invention is a raster scanning technique in which the writing spot dimensions of the electron beam are varied rapidly during the scan.

Briefly, these and other objects of the present invention are realized in a specific illustrative electron column designed for variable-spot raster scanning. In such a column, an illuminated aperture is demagnified to form the writing spot. By imaging a first aperture upon a second aperture and rapidly deflecting the image of the first aperture, the portion of the second aperture that is illuminated by the electron beam is altered. In that way, the writing spot size normal to the direction of scanning is selectively varied in a high-speed way during the raster scanning process.

BRIEF DESCRIPTION OF THE DRAWING

A complete understanding of the present invention and of the above and other objects may be gained from a consideration of the following detailed description presented hereinbelow in connection with the accompanying drawing, in which.

DETAILED DESCRIPTION

Figure 1:
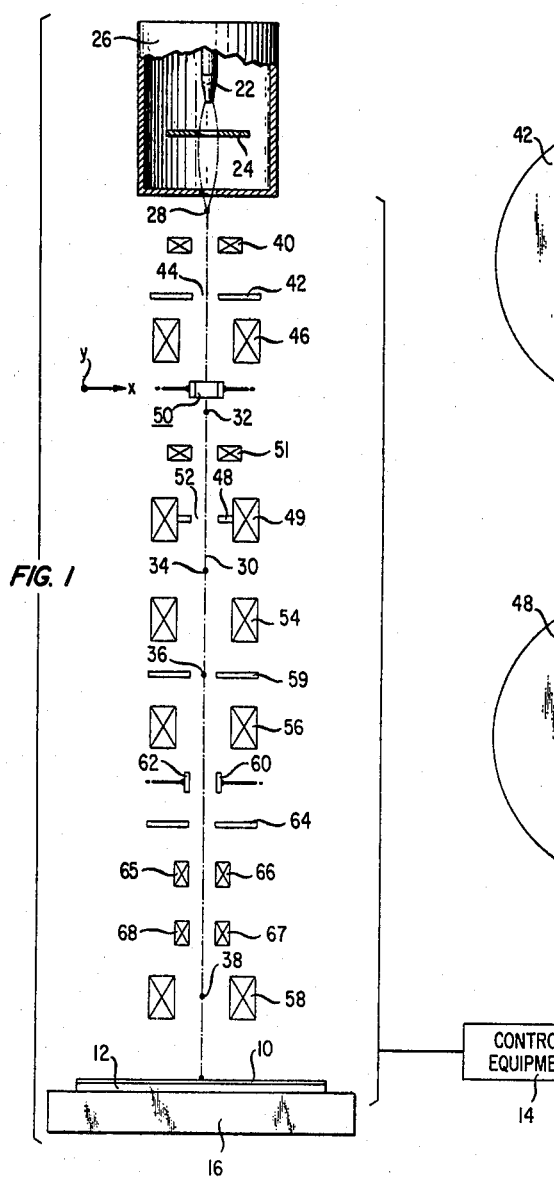
FIG. 1 is a diagrammatic representation of an electron beam column which is adapted to achieve variable-spot raster scanning.

FIG. 1 depicts a specific illustrative lithographic apparatus for controllably moving a variable-size electron spot to any designated position on the top surface of an electron-resist layer 10 supported on a substrate 12. In turn, the substrate 12 is mounted on a conventional x-y-movable table 16.

Various positive and negative electron-resist materials suitable for use as the layer 10 are well known in the art. By selectively scanning the electron spot over the surface of the resist layer 10 in a highly accurate and high-speed manner, it is possible to make integrated circuit masks or to write directly on a resist-coated silicon wafer to fabricate extremely small and precise low-cost integrated circuits. Some suitable resists for use as the layer 10 are described, for example, in a two-part article by L. F. Thompson entitled "Design of Polymer Resists for Electron Lithography", *Solid State Technology*, part 1: July 1974, pages 27–30; part 2: August 1974, pages 41–46.

The apparatus of FIG. 1 may be considered to comprise two main constituents. One is an electron beam column to be described in detail below, which is characterized by highly accurate high-speed deflection and blanking capabilities similar to those exhibited by the column described in U.S. Pat. No. 3,801,792, issued Apr. 2, 1974 to L. H. Lin. Additionally, in accordance with the principles of the present invention, the depicted column is further characterized by a variable-spot-size scanning capability. This last-mentioned capability in particular will be described in detail below.

The other main constituent of the FIG. 1 apparatus comprises control equipment 14. Illustratively, the equipment 14 is of the type described in the aforecited Collier-Herriott patent. The equipment 14 supplies electrical signals to the described column to systematically control scanning and blanking of the electron beam. Moreover, the equipment 14 supplies control signals to the x-y table 16 to mechanically move the work surface 10 during the electron beam scanning operation, as described in the Collier-Herriott patent.

Figure 16:
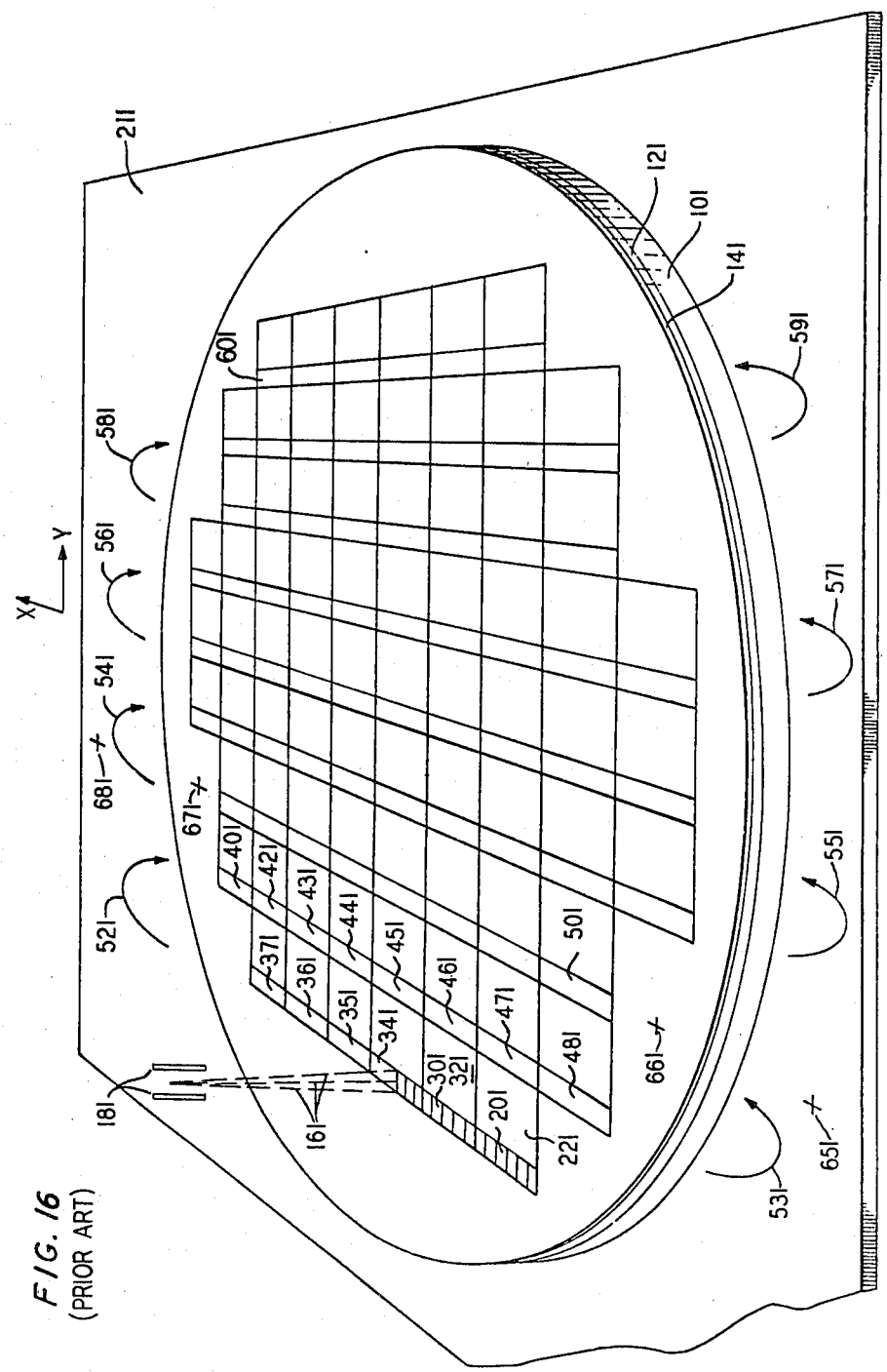
FIG. 16 shows a resist-coated wafer mounted on an x-y table and diagrammatically represents the manner in which the resist is irradiated by an electron beam in accordance with the principles described in the aforecited Collier-Herriott patent.

More specifically, the substrate or wafer shown in FIG. 16 (which corresponds to FIG. 1 of the Collier-Herriott patent) is positioned on a conventional motor-driven table 211 that is mechanically movable in both the X and Y directions. Large-area exposure of the electron resist material 141 is achieved by moving the table 211 continuously and in synchronism with the scanning beam provided by the column 181. In this way an area as large as 10×10 centimeters can be exposed efficiently despite the aforementioned relatively small electronic scan field.

In FIG. 16, scanning of the electron beam commences, for example, in the leftmost stripe area 201 of the lower left-hand subregion 221. To help in better visualizing the raster scan mode of operation of the beam in traversing the area 201, a portion of the subregion 221 of FIG. 16 including the stripe area 201 is shown in FIG. 17.

Figure 17:
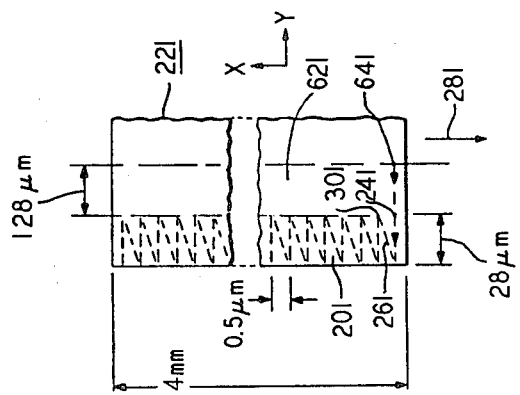
FIG. 17 depicts the Collier-Herriott raster scan mode of operation in a portion of the resist shown in FIG. 16.

The stripe area 201 of FIG. 17 is scanned by the aforementioned electron beam in a row-by-row fashion. Scanning commences in the bottom right-hand section of the area 201, at point 241. From that point the beam is deflected to the left along the indicated path which includes 256 address positions. During its right-to-left deflection the beam is intensity modulated at a 10 MHz rate.

Illustratively, each row of FIG. 17 is traversed by the electron beam in 25.6 microseconds. Between rows, so-called "flyback" of the beam occurs (see path 261). In one particular embodiment, the flyback time approximates 6 $\mu$sec. Thus if, during scanning, the area 201 is moved at a constant speed in the direction of arrow 281 at slightly less than 2 centimeters per second, the start (point 301) of the next row to be scanned will be exactly 0.5 $\mu$m above the starting point 241.

An electron beam exposure system made in accordance with the principles of the Collier-Herriott invention not only implements the afore-described raster scan mode of operation, but also automatically corrects for errors in the movement of the table 211. This is done by means of two conventional laser interferometers that continuously monitor the X and Y positions of the table. (For a description of such interferometer devices, employed in a pattern generating system that involves the scanning of a focused laser beam over a photographic plate, see D. R. Herriott-K. M. Poole-A. Zacharias U. S. Pat. No. 3,573,849, issued Apr. 6, 1971.) Electrical signals derived from these interferometers are utilized to deflect the electron beam in the X and Y directions to compensate for table movement errors (for example, errors stemming from nonuniform table speed). In one illustrative embodiment, repositioning the electron beam to compensate for such errors is rapid enough to maintain exposure of a pattern line accurate to within about 0.03 $\mu$m.

The exposure system described in the Collier-Herriott patent also includes a relatively low-speed error compensation feedback loop (to be described later below in connection with FIG. 18). This second-mentioned loop applies electrical signals (also derived from the interferometers) to X- and Y-direction servo motors that drive the table 211. In this way the table is moved to minimize positional errors.

As noted earlier above, the table 211 is continuously moving in the X direction as the electron beam is deflected from right to left in the Y direction. Nevertheless, the 256 address positions of the scanning beam in each row are disposed along a line parallel to the Y axis. No skewed scan results. This is so because the interferometers measure absolute table location to about a sixteenth of one address (approximately 0.03 $\mu$m). So, as will be described in more detail later below, each time the table moves a sixteenth of an address, the change in table position is fed back via the fast-compensation loop to deflect the beam to a corrected position. In that way the beam is controlled to write at successive row locations along a Y-parallel line.

The exposure system described herein relies on the aforementioned laser interferometers to provide an accurate indication of the position of the table 211. In addition, precise operation of the overall system presupposes an electron beam characterized by excellent short-term positional stability. As a practical matter, such stability of the beam is achievable in a well-engineered electron column (for example, one of the type disclosed in the above-cited Lin patent). But it is important to monitor and correct for any long-term drift of the electron beam stemming from, for example, electrical or thermal effects. Illustratively, this is done by periodically interrupting the aforedescribed exposure process and moving the table 211 to precisely determined positions. When the table is so positioned, the relatively stable beam can be expected to be directed approximately at preformed topographical features marked on the surface of the table (for mask fabrication) or on the surface of the wafer itself (for device fabrication). Illustrative registration or fiducial marks 651 through 681 are shown in FIG. 16.

Figure 18:
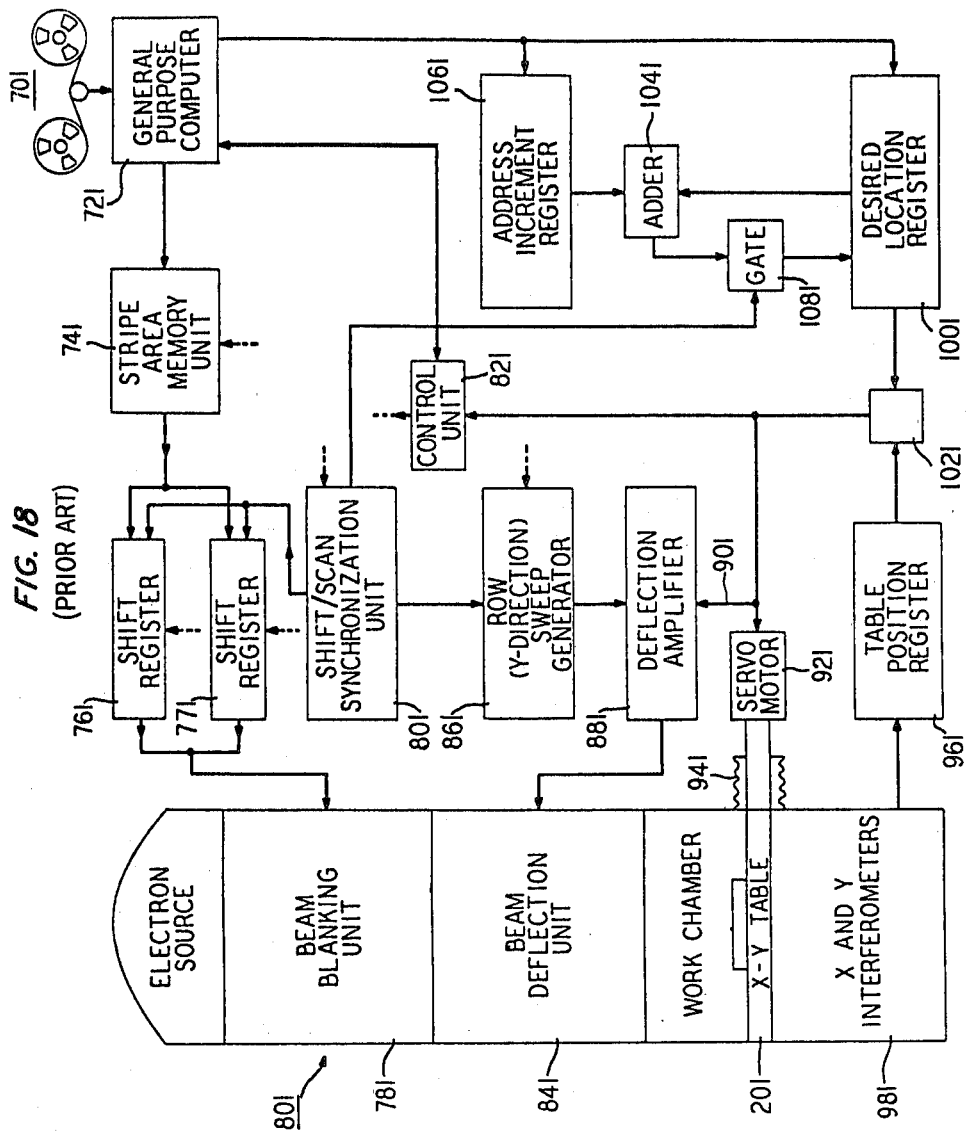
FIG. 18 is an overall block-diagram representation of an electron beam exposure system made in accordance with the principles described in the Collier-Herriott patent.

FIG. 18 is a block diagram representation of a specific illustrative electron beam exposure system made in accordance with the principles of the Collier-Herriott invention. Input data to the system is provided, for example, by a tape unit 701. Illustratively, this data is obtained by processing a standard XYMASK output file (see the Nov. 1970 *Bell System Technical Journal* issue for a description of the XYMASK system). In particular, the standard geometric formats stored in the XYMASK file are processed to form trapezoid-like figures. A group of such figures represents the pattern in a stripe area.

The system shown in FIG. 18 includes circuitry for continually determining the error, if any, that exists between the actual current position of the X-Y table 211 and its designated location. (The designated location is the intended or ideal table position for writing the next line or, if writing is in progress, the ideal position for the line currently being written.) Error signals generated by this circuitry are supplied to the deflection amplifier 881 to achieve a very rapid compensating deflection of the electron beam. In addition, such signals are applied via a servo motor 921 to a drive train 941 that is mechanically coupled to the table 211 to drive it in the X and/or Y directions to reduce the actual table position error. Advantageously, the motor 921 is a variable-speed unit.

Table position register 961 stores the X-Y coordinates (measured with respect to a reference origin on the table 211) of the present position of the X-Y table. The coordinates are determined in a conventional way by counting pulses provided by standard X and Y laser interferometers 981 (mounted on the table 211) as the table moves from its reference origin. Illustratively, each pulse represents a displacement of about 0.03 μm.

Desired location register 1001 contains the X-Y coordinates of the table position, as specified by the computer 721. By subtracting (in unit 1021) the contents of the registers 961 and 1001, a signal is obtained that is representative of table position error. The magnitude of this signal is sensed by control unit 821 which determines whether or not the table 211 is close enough to its intended location to allow writing to continue. If the error is sensed to be within prescribed limits, writing is allowed to proceed. In that event, the output of the subtractor unit 1021 is applied to the deflecting amplifier 881 to move the electron beam to the designated location in a high-speed manner. In any case this error signal is also applied to the servo motor 921 which mechanically drives the table 211 to minimize the difference between the contents of the registers 961 and 1001.

After each Y-direction scan of the electron beam, the desired location register 1001 is updated by one address position. This is done, for example, by adding (in unit 1041) the contents of an address increment register 1061 to the present contents of the desired location register 1001. In the specific embodiment described herein, the value stored in the register 1061 is ordinarily 0.5 μm. But the value stored therein may be something else if, for example, it is necessary during device fabrication to compensate for deformations in the wafer being processed. In any event, gating into the register 1001 of the new coordinate values of the next desired beam location is controlled by a "next-row-please" signal applied to gate 1081 from the synchronization unit 801.

The specific illustrative electron column of FIG. 1 includes an electron source 22 (for example, a tungsten filament), an electrode 24 and an accelerating anode 26 which comprises a cylindrical metal cap with a central aperture in the bottom flat end thereof maintained at ground potential. In that case the source 22 is maintained at a relatively high negative potential (for example, 10 kilovolts below ground).

The inital trajectories of electrons supplied by the source 22 of FIG. 1 are represented in the drawing by dashed lines. In the vicinity of the aforementioned aperture in the anode 26 these trajectories go through a so-called crossover or source image point 28 which, for example, is 35 μm in diameter. Thereafter the electron paths successively diverge and converge as the electrons travel downstream along longitudinal axis 30 toward the work surface 10. Successive crossovers or images of the source point 28 are represented in FIG. 1 by dots 32, 34, 36 and 38 disposed along the axis 30.

Advantageously, the electron column of FIG. 1 includes coils 40 by means of which the electron trajectories emanating from the aforedescribed source point 28 may be exactly centered with respect to the longitudinal axis 30. Thereafter the electron beam is directed at a plate 42 which contains a precisely formed aperture 44 therethrough. The beam is designed to uniformly illuminate the full extent of the opening or aperture 44 in the plate 42 and to appear on the immediate downstream side of the plate 42 with a cross-sectional area that corresponds exactly to the configuration of the aperture 44.

Figure 2:
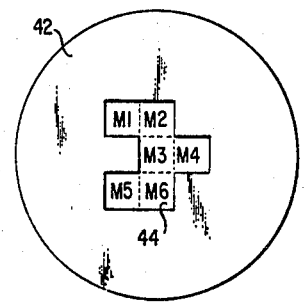
FIGS. 2 and 3 are specific illustrative depictions of the respective geometries of two apertures that may be included in the FIG. 1 column.

A top view of one advantageous geometry for the aperture 44 in the plate 42 of FIG. 1 is shown in FIG. 2. Illustratively the plate 42 comprises a disc of molybdenum in which the depicted aperture 44 is formed in a high-precision way by, for example, conventional laser machining techniques.

The dashed lines within the opening 44 of FIG. 2 are included simply to facilitate subsequent discussion. In actuality the opening 44 is a single continuous aperture having straight edges as indicated by the solid straight lines. Illustratively, the single aperture 44 may be regarded as composed of six square segments, each defined by one or more solid straight lines and one or more dashed straight lines. In FIG. 2 the square segments are designated M1 through M6. In one particular illustrative embodiment of the present invention, each of the squares M1 through M6 measures 100 μm on a side. When the plate of FIG. 2 is mounted in the FIG. 1 column, the longitudinal axis 30 of the column is perpendicular to and extends through the mid-point of the square M3 shown in FIG. 2.

As stated above, the cross-sectional configuration of the electron beam that passes through the mask plate 42 of FIG. 1 is determined by the geometry of the aperture 44. In turn, this beam configuration propagates through a conventional electromagnetic lens 46 (for example, an annular coil with iron pole pieces) which forms an image of the aforedescribed aperture 44 on a second mask plate 48 (FIG. 1). Plate 48 contains a precisely formed aperture 52. Illustratively, the plate 48 is mounted on and forms an integral unit with electromagnetic field lens 49. The lens 49 is not designed to magnify or demagnify the cross-sectional configuration of the electron beam on the immediate downstream side of the plate 48. But in combination with a next subsequent downstream lens, to be described later below, the lens 49 serves to maximize the transmision of electrons along the depicted column. With the next lens the lens 49 is effective to image the crossover point 28 to the center of beam-limiting aperture 59.

A predetermined quiescent registration of the image of the aperture 44 on the plate 48 of FIG. 1 is assured by including registration coils 51 in the depicted column.

In accordance with the principles of the present invention, the location of the image of the illuminated aperture 44 on the plate 48 of FIG. 1 is selectively controlled in a high-speed way during the time in which the electron beam is being scanned over the work surface 10. This is done by means of deflectors 50 positioned, for example, as shown in FIG. 1 to move the beam in the x and/or y directions. Advantageously, the deflectors 50 comprise two pairs of orthogonally disposed electrostatic deflection plates. Electromagnetic deflection coils may be used in place of the electrostatic plates, but this usually leads to some loss in deflection speed and accuracy. Whether electrostatic or electromagnetic deflection is employed, the deflectors 50 may also be utilized to achieve registration of the image of aperture 44 in the second mask plate 48. This is done by applying a steady-state centering signal to the deflectors 50. In such a case the separate registration coils 51 may, of course, be omitted from the column.

Figure 3:
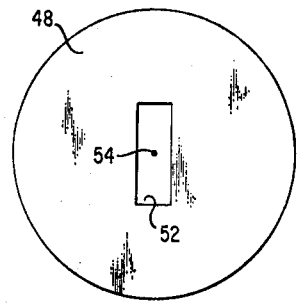

Before proceeding to describe further the components included in the electron column of FIG. 1, it will be helpful to specify the nature of the mask plate 48 and to illustrate the effect of moving the location of the image of the aperture 44 on the plate 48. A top view of a specific illustrative element suitable for inclusion in the FIG. 1 column as the mask plate 48 is shown in FIG. 3. Aperture 52 in the plate 48 may, for example, have the shape shown in FIG. 3. In one particular embodiment of this invention, the aperture 52 is a laser-machined opening measuring 100 by 300 $\mu$m. Centrally located dot 54 in FIG. 3 indicates the location of the longitudinal axis 30 of FIG. 1 when the plate 48 is mounted in the column of FIG. 1.

Quiescently, the aperture 44 of the mask plate 42 is imaged by the lens 46 of FIG. 1 onto the center of mask plate 48. Illustratively, the image projected by the lens 46 onto the plate 48 corresponds exactly in size with the dimensions of the aperture 44. (If desired, the lens 46 may, of course, be designed to achieve other than a 1:1 projection of the aperture 44. Or in some cases of practical interest, the lens 46 may be omitted altogether.) By means of the coils 51 the image so projected is precisely centrally registered on the plate 48, as indicated in FIG. 4.

Figure 4:
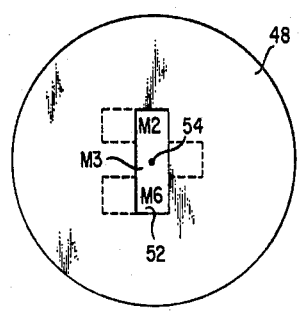
FIGS. 4 through 11 are respective superimposed showings of the apertures of FIGS. 2 and 3 to represent the result of deflecting the image of the FIG. 2 aperture with respect to the FIG. 3 aperture.

From FIG. 4 it is apparent that only the segments M2, M3 and M6 of the projected image of the illuminated aperture 44 are transmitted through the rectangular aperture 52 in the mask plate 48. Accordingly, for the depicted registration, the electron beam appearing immediately downstream of the plate 48 has a cross-sectional area corresponding exactly to the geometry of the aperture 52. Hence, for the particular illustrative case in which the aperture 52 constitutes an opening 100 $\mu$m wide and 300 $\mu$m high, the cross-section of the electron beam immediately downstream of the plate 48 exhibits the same dimensions.

Subsequently, the cross-sectional area of the electron beam transmitted through the plate 48 of the electron column of FIG. 1 is demagnified. This is done by means of three conventional electromagnetic lenses 54, 56 and 58. In one specific illustrative embodiment of the principles of the present invention, these lenses are designed to achieve an overall demagnification of the beam propagated therethrough by a factor of 400. More particularly, these lenses are selected to demagnify the aforementioned cross-sectional area of the beam transmitted by the mask plate 48 and to image a reduced counterpart thereof on the work surface 10. For an overall demagnification of 400, and for the specific illustrative case in which the cross-section of the beam immediately downstream of the plate 48 measures 100 by 300 $\mu$m, the electron spot imaged on the surface 10 will quiescently be a rectangle 0.25 $\mu$m wide and 0.75 $\mu$m high.

The other elements included in the column of FIG. 1 are conventional in nature and may, for example, be identical to the corresponding parts included in the column described in the aforecited Lin patent. These elements include the beam-limiting aperture 59, electrostatic beam blanking plates 60 and 62, an apertured blanking stop plate 64 and electromagnetic deflection coils 65 through 68.

If the beam blanking plates 60 and 62 of FIG. 1 are activated, the electron beam propagating along the axis 30 is deflected to impinge upon a nonapertured portion of the plate 64. In that way the electron beam is blocked during prescribed intervals of time from appearing at the surface 10. If the beam is not so blocked, it is selectively deflected by the coils 65 through 68 to appear at any desired position in a specified sub-area of the work surface 10. Access to other sub-areas of the surface 10 is gained by mechanically moving the surface by means, for example, of a computer-controlled micromanipulator, as described in the aforecited Collier-Herriott patent.

As specified above, the rectangular electron spot provided by centrally positioning the image of the aperture 44 on the mask plate 48 is controlled by the column of FIG. 1 to impinge or not onto a specified location of the work surface 10.

Figure 12:
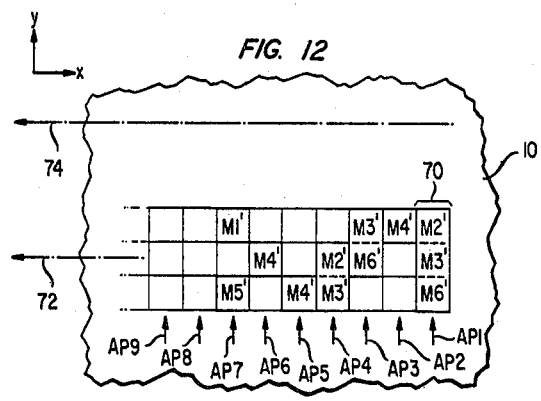
FIG. 12 shows a portion of a pattern written by the herein-described variable-spot raster scanning technique using the column of FIG. 1 equipped with the apertures of FIGS. 2 and 3.

A demagnified version of the rectangular area composed of segments M2, M3 and M6 (FIG. 4) is shown in FIG. 12 and designed by reference numeral 70. For ease of conceptualization and discussion, the rectangular electron spot 70 that impinges on the work surface 10 of FIG. 12 is shown divided into three square segments M2', M3' and M6'. These segments correspond respectively to portions M2, M3 and M6 of FIG. 4. For the particular illustrative case assumed above in which the overall demagnification is 400, each of the segments M2', M3' and M6' measures 0.25 $\mu$m on a side.

Scanning of the beam provided by the electron column of FIG. 1 is represented in FIG. 12 as occurring from right to left in the $-x$ direction along center line 72. Illustratively, 512 equally spaced-apart address positions are assumed to lie along the scanning center line 72. The location of the first several ones of these address positions are indicated in FIG. 12 by arrows designated AP1 through AP9. At each address position during the linear scan, the electron beam is blanked or not in the manner described above. Additionally, in accordance with the principles of the present invention, the area of the beam that impinges upon the work surface 10 at each address position is selectively controlled.

As the variable-size electron spot is deflected along a row of the scan field, the spot is intensity modulated by the beam blanking plates 60 and 62 at, for example, a 10 megahertz rate. This modulation rate corresponds with a single-address exposure time of 100 nanoseconds, which is compatible with the sensitivities of available electron resist materials.

At the completion of each scan line, the electron beam is rapidly deflected to an initial position to start a next adjacent scan line. In the particular case illustrated in FIG. 12, such deflection or "fly back" positions the beam above address position AP1 on a new scanning center line 74 which is parallel to and 0.75 $\mu$m above the line 72. In this way, successive lines of a subregion of the work surface 10 are selectively irradiated in a raster-scan fashion. This raster scan mode of operation (without the variable-spot-size feature) is described in detail in the aforecited Collier-Herriott patent.

In accordance with the principles of the present invention, the geometry of the electron spot directed at the surface 10 is varied during scanning in a high-speed way in response to control signals applied by the equipment 14 (FIG. 1) to the deflectors 50. Thus, for example, by applying appropriate deflection potentials to the deflectors 50, the image of the aperture 44 on the mask plate 48 may be moved in the x and/or y directions. The effect of doing so is illustrated in the next-described set of Figures.

Figure 5:
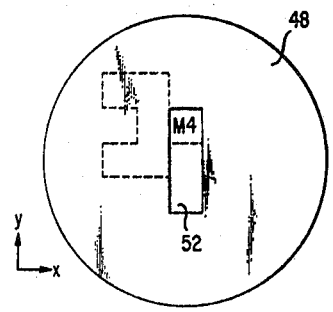

FIG. 5 represents the case wherein the projected image of the aperture 44 has been deflected by the array 50 100 $\mu$m in the +y direction and 100 $\mu$m in the −x direction. The effect of this relative disposition is that only the illuminated segment M4 of the projected image is transmitted through the opening 52 in the mask plate 48. In turn, a demagnified version (M4') of the segment M4 is projected onto the work surface 10. This 0.25 by 0.25 $\mu$m version is shown in FIG. 12 as being located at the address position AP2.

In one illustrative mode of operation that is characteristic of the present invention, the deflection signals applied to the deflectors 50 of FIG. 1 are changed (if necessary) while the scanning electron beam is approximately midway between adjacent address positions. Establishment of the new deflection signals is carried out in a high-speed way. Thus, for example, for the case assumed above wherein each single-address exposure time is 100 nanoseconds, the deflection signals required to achieve a specified spot size are, for example, established by the control equipment 14 in about 10 nanoseconds or less.

The geometrical superposition illustrated in FIG. 5 is achieved, for example, by changing the deflection signals applied to the deflectors 50 of FIG. 1 while the scanning electron beam is about midway between the address positions AP1 and AP2 (FIG. 12). In practice, voltage swings of about 5 to 10 volts applied to electrostatic deflection plates are sufficient to change the quiescent representation shown in FIG. 4 to the deflected condition represented in FIG. 5. Such changes can be realized by means of ultra-high-speed amplifiers in about 5 to 10 nanoseconds.

Figure 6:
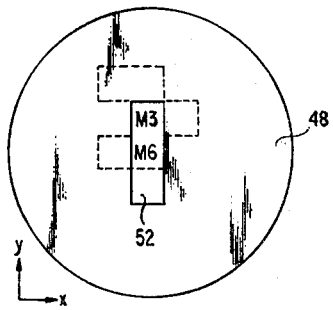
Figure 7:
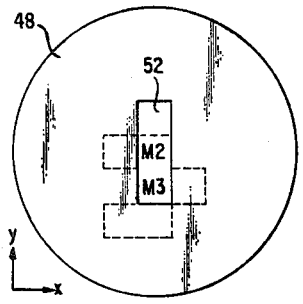
Figure 8:
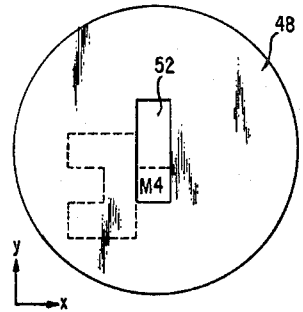
Figure 9:
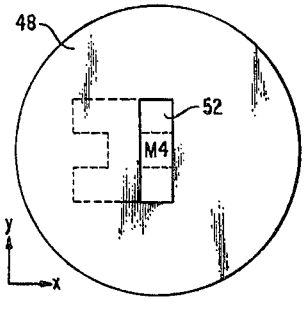
Figure 10:
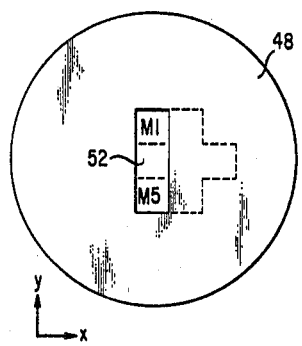

FIG. 6 represents the case wherein the projected image of the aperture 44 has been deflected 100 $\mu$m in the +y direction by the deflectors 50. As a result, illuminated segments M3 and M6 of the projected image are transmitted through the opening 52 in the mask plate 48. In turn, a demagnified version (M3', M6') of the segments M3 and M6 is projected onto the work surface 10. This 0.25 by 0.5 $\mu$m version is shown in FIG. 12 located at the address position AP3.

FIGS. 7 through 10 illustrate other geometrical superpositions that may be achieved in accordance with the principles of the present invention. The demagnified electron spots that respectively correspond to the superpositions depicted in FIGS. 7 through 10 are shown in FIG. 12 at the address positions AP4 through AP7. Each such superposition is achieved in the manner described above by the deflectors 50 deflecting the image of the aperture 44 100 $\mu$m in the x and/or y directions.

Figure 11:
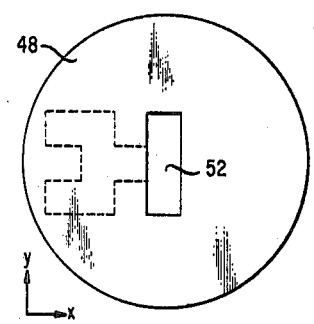

As described above, blanking of the electron beam is achieved in the column of FIG. 1 by means of the plates 60 and 62 and the blanking stop plate 64. Alternatively, blanking may be achieved by activating the deflectors 50 to deflect the projected image of the aperture 44 sufficiently far with respect to the opening 52 in the mask plate 48 that no portion of the projected image overlies the opening 52. This condition, which is represented in FIG. 11, requires that the deflectors 50 deflect the noted image 200 $\mu$m in the −x direction. (Of course, a deflection of 200 $\mu$m in the +x direction would suffice also.) In some cases of practical interest, such a relatively large deflection can be achieved by the deflectors 50 sufficiently rapidly so as to make this alternative blanking technique a feasible one. In such cases the elements 60, 62 and 64 can, of course, be omitted from the FIG. 1 column.

Figure 13:
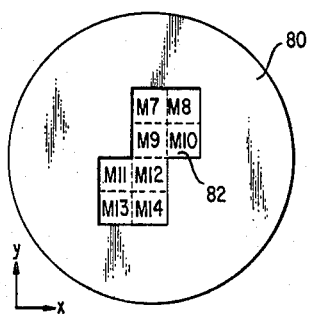
FIGS. 13 and 14 are specific illustrative depictions of the respective geometries of two additional apertures that may be included in the FIG. 1 column.
Figure 14:
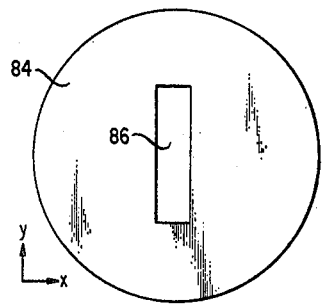

As mentioned above, the particular configurations of the apertures included in the mask plates 42 and 48 of FIGS. 2 and 3 are illustrative only. It is apparent that a variety of other configurations may be selected to achieve the selective superposition that is the basis for the herein-described variable-spot-size technique. Two such other aperture geometries are shown in FIGS. 13 and 14. Mask plate 80 with aperture 82 therethrough (see FIG. 13) may be substituted for the mask plate 42 shown in the column of FIG. 1. And mask plate 84 with aperture 86 therethrough (FIG. 14) may be substituted for the mask plate 48 in FIG. 1. By way of example, each of the segments M7 through M14 of the aperture 82 of FIG. 13 is assumed to measure 100 $\mu$m on a side, and the rectangular aperture 86 of FIG. 14 is assumed to be 100 $\mu$m wide and 400 $\mu$m high.

By deflecting the projected image of the aperture 82 of FIG. 13 with respect to the aperture 86 of FIG. 14, it is possible to form a variety of electron spot sizes on the surface 10. In turn, this capability makes it possible to irradiate high-resolution patterns on the surface 10 in a high-speed manner.

Figure 15:
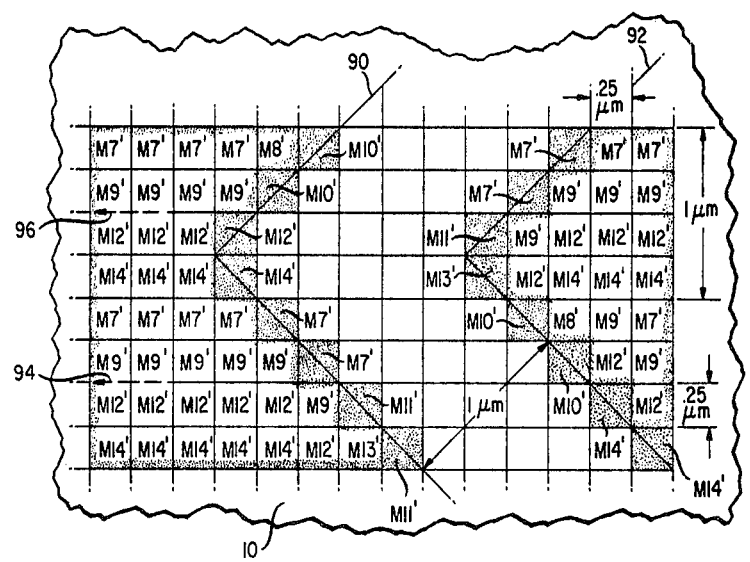
FIG. 15 shows a portion of a particular pattern written by the herein-described variable-spot raster scanning technique using the column of FIG. 1 equipped with the specific apertures of FIGS. 13 and 14.

A portion of a chevron pattern irradiated in accordance with the principles of the present invention and employing the aperture pair 82 and 86 is shown in FIG. 15. Lines 90 and 92 are the actual idealized boundaries of the pattern to be defined on the surface 10. The depicted grid formed of horizontal and vertical lines spaced 0.25 $\mu$m apart is not actually included on the surface 10 but is shown only to facilitate understanding of FIG. 15. Lines 94 and 96 are scanning center lines corresponding to the lines 72 and 74 of FIG. 12.

Assume that scanning of the surface 10 of FIG. 15 occurs from right to left, first along the center line 94 and then along the line 96. Those squares of the grid that are irradiated by the electron beam during variable-spot-size raster scanning of the surface are shown shaded. Each such shaded aquare is designated with a primed symbol to indicate which corresponding demagnified portion of the illuminated aperture 82 actually impinges on the surface 10. The variable-height rectangular spots shown in FIG. 15 at respective address positions are achieved by successively deflecting the image of the aperture 82 by 100 $\mu$m in each of the x and/or y directions.

As specified above, an illustrative electron beam exposure system made in accordance with the principles of the present invention may have an address length of 0.25 $\mu$m and a spot dimension that can, for example, be varied from a square 0.25 $\mu$m on a side to a rectangle 0.25 $\mu$m by 1 $\mu$m. For a given writing spot exposure time, such a system can expose areas at a rate about four times as fast as can be achieved with conventional raster scanning of a fixed-size spot 0.25 $\mu$m in diameter. Or a system equipped for variable-spot raster scanning as specified herein can write patterns with 0.25 $\mu$m resolution as fast as a conventional exposure system writes patterns with 0.5 $\mu$m resolution.

It is to be understood that the above-described arrangements are only illustrative of the application of the principles of the present invention. In accordance with these principles, numerous other arrangements may be devised by those skilled in the art without departing from the spirit and scope of the invention. For example, although primary emphasis herein has been directed to the case of varying the extent of an electron spot in the direction normal to the scanning direction, it is emphasized that the principles of the present invention also encompass the case wherein spot size or location is varied in the direction of scanning. Moreover, these principles are also applicable to radiant beams other than electron beams (for example light, X-ray and ion beams).

What is claimed is:

1. A method for achieving variable-spot-size scanning of an electron beam in a lithographic exposure system adapted to fabricate microminiature devices, said method comprising the steps of directing an image of a single electron-beam-illuminated aperture onto a mask plate which has a single aperture therethrough, and successively controlling the registration of said image with respect to said second-mentioned mask plate aperture during said scanning to establish plural different cross-sectional configurations of the beam that is transmitted through said second-mentioned mask plate aperture thereby to selectively define variable spot sizes during said scanning.

2. A method as in claim 1 further including the steps of scanning said beam over the surface of a planar electron-resist layer along successive scan lines in raster fashion, and blanking said beam at specified ones of successive address locations of each scan line.

3. A method of fabricating microminiature devices by scanning a charged-particle beam over the surface of a planar charged-particle-sensitive layer to irradiate variable-spot-size portions of said surface positioned at address locations along plural spaced-apart scan lines, said method comprising the steps of directing said beam to uniformly illuminate only a single beam-propagating aperture contained in a first mask plate, projecting an image of the beam transmitted through said aperture onto a second mask plate which contains only a single beam-propagating aperture therethrough, and at successive address locations of each scan line deflecting said image with respect to the aperture in said second plate to control the portion of said image that overlies the aperture in said second plate thereby to establish at each address location the size of the beam directed at said layer.

4. A method as in claim 3 wherein said beam constitutes an electron beam and the size of the beam directed at said layer is varied in a direction perpendicular to the direction of scanning, said method further including the steps of scanning said beam over the surface of said planar layer along successive scan lines in raster fashion, and blanking said beam at specified address locations of a scan line.

5. Apparatus for scanning a variable-spot-size electron beam over a work surface to irradiate selected portions of the surface, said apparatus comprising a first mask plate having only a single beam-propagating aperture therethrough, means for directing an electron beam at said first mask plate to illuminate said single aperture in its entirety, a second mask plate having only a single beam-propagating aperture therethrough, means for directing an image of the beam transmitted through the aperture in said first mask plate onto said second mask plate to align said image in a predetermined relationship with respect to the aperture in said second mask plate whereby only that portion of said image that overlies the aperture in said second mask plate is transmitted through said second mask plate;

and means for selectively deflecting said image with respect to the aperture in said second mask plate to alter the predetermined alignment therebetween thereby to vary the cross-sectional area of the electron beam that is transmitted through said second mask plate toward said work surface during scanning.

6. Apparatus as in claim 5 wherein a main longitudinal axis of said apparatus extends perpendicular to said first and second mask plates and said axis defines the path along which an undeflected image of the beam transmitted through the aperture in said first mask plate is propagated, and wherein each of said apertures is defined by straight-line edges in its respective plate.

7. Apparatus as in claim 6 wherein the cross sections of said apertures as viewed along said axis are non-coincident.

8. Apparatus as in claim 6 wherein the configurations of the apertures in said first- and second-mentioned plates are dissimilar.

9. Apparatus as in claim 6 wherein at least one of said apertures is non-rectangular.

10. Apparatus as in claim 9 wherein one of said apertures is rectangular and has a cross section which, as viewed along said axis, is coincident with only a constituent part of the cross section of the other aperture.

11. Apparatus as in claim 10 further including means for scanning said beam in a raster fashion over a planar work surface along plural scan lines each of which has a multiplicity of address locations therealong, and means for controlling said deflecting means to establish a predetermined deflection of said beam at each address location along a scan line in synchronism with the scanning of said beam thereby to selectively vary the extent of said beam on said planar surface at each address location.

12. A method of projecting a beam of charged particles to a target through two apertured marks which comprises directing a beam of charged particles on the first of said masks, passing said beam through the aperture of said first mask to establish a beam cross-section corresponding to the contour of said first mask aperture, deflecting said beam, after passing through the first of said masks and before passing through the second of said masks, in a transverse direction and by a given distance with respect to said second aperture, focusing the deflected beam on the second of said masks, passing only a portion of said beam through the aperture of said second mask to modify the cross-section of said beam in accordance with the contour of said second mask aperture and the direction and distance of said deflection to thereby establish by the combined interceptive action of said masks a predetermined beam cross-section at the incidence of the beam on the target.

13. A method according to claim 12 wherein said masks have apertures each of polygonal contour, and the beam is deflected in a direction generally parallel to one side of the polygonal aperture of one of said masks.

14. A method according to claim 12 wherein said beam of charged particles is a beam of electrons.

15. A method according to claim 12 wherein said beam of charged particles is a beam of ions.

16. In an apparatus for projecting a beam of charged particles to a target through two apertured masks, means operable to direct a beam of charged particles upon the first of said masks and to pass said beam through the aperture of said first mask to establish a beam cross-section corresponding to the contour of said first mask aperture, deflector means positioned to deflect said beam, after passing through the first of said masks and before passing through the second of said masks, said deflector means deflecting said beam with respect to said second aperture in a transverse direction and by a given distance to pass through a predetermined region of a transverse two-dimensional plane, lens means operable to focus the deflected beam upon the second of said masks and to pass only a portion of said beam through the aperture of said second mask to modify the cross-section of said beam in accordance with the contour of said second mask aperture and the distance and direction of said deflection to thereby establish by the combined interceptive action of said masks a predetermined beam cross-section at the incidence of the beam on the target.

17. An apparatus according to claim 16 wherein said masks have apertures each of a polygonal contour.

18. An apparatus according to claim 17 wherein said target is a substrate in which electric circuits are built.

19. An electron beam exposure system comprising a source for emitting an electron beam; means comprising two aperture plates having multi-sided openings and an electron beam lens and a first deflecting means located between said two aperture plates, said electron beam lens serving to focus the image of the first aperture plate on the second aperture plate, said first deflecting means serving to vary the shape and size of said electron beam cross-section through the combined interceptive action of said two aperture plates; an electron optical system for converging and projecting the electron beam thus shaped onto a workpiece; a driving means for shifting the workpiece continuously in a selected direction; and a second deflecting means for deflecting the electron beam in a narrow band range on the workpiece more or less perpendicular to said selected direction.

20. An electron beam exposure system comprising a source for emitting an electron beam; means comprising two aperture plates having multi-sided openings and an electron beam lens and a first deflecting means located between said two aperture plates, said electron beam lens serving to focus the image of the first aperture plate on the second aperture plate, said first deflecting means serving to vary the shape and size of said electron beam cross-section through the combined interceptive action of said two aperture plates; an electron optical system for converging and projecting the electron beam thus shaped onto a workpiece; a driving means for shifting the workpiece continuously in a selected direction; a second deflecting means for deflecting the electron beam in a narrow band range on the workpiece more or less perpendicular to said selected direction; and means for generating a signal each time the workpiece shifts by a certain constant amount in the selected direction, said signal being used as a synchronizing signal for controlling the first deflecting means comprising part of said beam shaping means.

21. An electron beam exposure system according to claim 20 in which said signal generating means incorporates a laser interferometer.

22. An electron beam exposure system comprising a source for emitting an electron beam; means comprising two aperture plates having multi-sided openings and an electron beam lens and a first deflecting means located between said two aperture plates, said electron beam lens serving to focus the image of the first aperture plate on the second aperture plate, said first deflecting means serving to vary the shape and size of said electron beam cross-section through the combined interceptive action of said two aperture plates; an electron optical system for converging and projecting the electron beam thus shaped onto a workpiece; blanking means for interrupting the electron beam projected on the workpiece; a driving means for shifting the workpiece continuously in a selected direction; a second deflecting means for deflecting the electron beam in a narrow band range on the workpiece more or less perpendicular to said selected direction; and means for generating a signal each time the workpiece shifts by a certain constant amount in the selected direction, said signal being used as a synchronizing signal for controlling said blanking means.

23. An electron beam exposure system comprising a source for emitting an electron beam; means comprising two aperture plates having multi-sided openings and an electron beam lens and a first deflecting means located between said two aperture plates, said electron beam lens serving to focus the image of the first aperture plate on the second aperture plate, said first deflecting means serving to vary the shape and size of said electron beam cross-section through the combined interceptive action of said two aperture plates; an electron optical system for converging and projecting the electron beam thus shaped onto a workpiece; a driving means for shifting the workpiece continuously in a selected direction; a second deflecting means for deflecting the electron beam in a narrow band range on the workpiece more or less perpendicular to said selected direction; means for generating a signal each time the workpiece shifts by some constant amount in the selected direction, and a third deflecting means for tracking the electron beam by some constant amount in said selected direction in response to said signal.

24. An electron beam exposure method for projecting an electron beam having a selectable cross section onto a workpiece, said method comprising the steps for:
A. controlling the electron beam to produce an elongate rectangular cross section,
B. projecting said electron beam onto a workpiece,
C. deflecting said projected electron beam over the workpiece, and
D. varying the length of the cross section of the beam in accordance with the pattern to be exposed and concomitant with the deflection of the electron beam.

25. An electron beam exposure method according to claim 24 in which step A is carried out by deflecting the image of one aperture plate upon a subsequent apertured plate with a deflector arranged therebetween.

* * * * *